United States Patent
De Vrieze et al.

(10) Patent No.: US 6,404,286 B2
(45) Date of Patent: Jun. 11, 2002

(54) ELECTRICAL ARRANGEMENT HAVING IMPROVED FEEDBACK STABILITY

(75) Inventors: Guido Eduard De Vrieze; Dirk Wouter Johannes Groeneveld, both of Nijmegen (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/902,216

(22) Filed: Jul. 10, 2001

(30) Foreign Application Priority Data

Jul. 11, 2000 (EP) ............................................. 00202459

(51) Int. Cl.[7] ................................................. H03F 1/38
(52) U.S. Cl. ........................................ 330/291; 330/290
(58) Field of Search ................................. 330/290, 291, 330/292, 293, 294

(56) References Cited

U.S. PATENT DOCUMENTS

| | | | |
|---|---|---|---|
| 5,121,080 A | 6/1992 | Scott et al. | 330/260 |
| 5,315,266 A | 5/1994 | Lorenz | 330/294 |
| 5,710,522 A * | 1/1998 | Pass | 330/291 |
| 5,736,900 A | 4/1998 | Smith | 330/265 |
| 5,793,255 A * | 8/1998 | Jesser | 330/290 |
| 5,986,509 A * | 11/1999 | Lohninger | 330/290 |
| 6,268,772 B1 * | 7/2001 | Chen | 330/288 |

* cited by examiner

*Primary Examiner*—Robert Pascal
*Assistant Examiner*—Henry Choe
(74) *Attorney, Agent, or Firm*—Steven R. Biren

(57) ABSTRACT

An electrical circuit arrangement (19), comprising an output stage (4) having an output terminal (2) for delivering an output current, and at least one feedback circuit (15, 16) operatively connected to the output terminal (2). A current generator circuit (20), arranged for generating a current which is a fraction of the output current, connects by a resistive element (21) to the output terminal (2), thereby providing improved high frequency feedback stability.

11 Claims, 1 Drawing Sheet

ELECTRICAL ARRANGEMENT HAVING IMPROVED FEEDBACK STABILITY

FIELD OF THE INVENTION

The present invention relates to an electrical circuit arrangement, comprising an output stage having an output terminal for delivering an output current, and at least one feedback circuit operatively connected to said output terminal.

An electrical circuit arrangement of this type is generally known from U.S. Pat. No. 5,315,266.

For obtaining a sufficient output current transient response and power ripple rejection, a capacitor is connected between the output terminal and signal ground, for example.

As will be appreciated by those skilled in the art, non-ideal capacitors can be represented by an equivalent series circuit comprising a capacitance, an equivalent series resistance (ESR) and an equivalent series inductance (ESL). At the so-called eigenfrequency of the capacitor, the capacitance and equivalent series inductance form a series resonant circuit having zero impedance. Accordingly, between the output terminal and signal ground an impedance equal to the equivalent series resistance remains.

In practice, capacitors are used having a relatively large capacitance value, for example 2.2 $\mu$F, and a very low equivalent series resistance. At the eigenfrequency of such a capacitor, the output terminal is effectively short circuited to signal ground, as a consequence of which the feedback circuitery is inoperative.

To avoid short circuiting of the output terminal, in the known circuit arrangement, a resistor or resistive element having a low resistance value is connected between the output terminal of the output stage and the capacitor. However, by such a resistor or resistive element, the output impedance of the circuit arrangement is undesirably increased. In particular, if the arrangement has to operate as a voltage or current control device and in those cases wherein the output stage has to operate like a switch, the output impedance at the output terminal should be as less as possible.

SUMMARY OF THE INVENTION

It is an object of the present invention to provide an electrical circuit arrangement of the type mentioned in the preamble, having an improved feedback stability while maintaining a low output impedance.

According to the invention, this is achieved by a current generator circuit, arranged for generating a current which is a fraction of the output current, wherein the current generator circuit connects by a resistive element to the output terminal, and a first feedback circuit connects via the resistive element to the output terminal.

During operation, in the circuit arrangement according to the invention, the current of the current generator circuit, which is a replica of the output current delivered by the output stage, causes a voltage drop across the resistive element, which voltage drop is a representation of the output voltage at the output terminal. In other words, the signal across the resistive element provides a copy of the signal at the output terminal for feedback purposes without increasing the output impedance of the circuit arrangement at the output terminal.

In a further embodiment of the invention by coupling the first feedback circuit to the resistive element through a capacitor or an element with capacitive action, the DC settings of the circuit are not influenced, while a high frequency feedback loop is achieved which remains operative even if the output terminal is short circuited or nearly short circuited at the eigenfrequency of an external capacitor connected to the output terminal. As a result, the circuit arrangement according to the invention can be controlled at high frequencies at or near the eigenfrequency of the capacitor and, compared to the prior art solution, with a larger open loop gain, i.e. lower output impedance.

In a yet further embodiment of the circuit arrangement according to the invention, a second feedback circuit connects by a resistive voltage devider to the output terminal, providing a low frequency DC feedback loop. In the circuit according to the invention, the accuracy of this low frequency DC feedback loop is not affected by an additional impedance at the output terminal.

As a whole, the electrical circuit arrangement according to the invention, with the first and second feedback circuitry enjoys an enhanced operation frequency bandwidth by the "virtual damping" introduced and which is not present in the output impedance at the output terminal of the arrangement.

In a practical embodiment of the invention, the fraction of the output current generated by the current generator circuit is less than 0.1 and, preferably, in the order of 0.01.

In a preferred embodiment of the invention, the output stage comprises a first field effect transistor and the current generator circuit comprises a second field effect transistor, wherein the W/L-ratio of the second field effect transistor divided by the W/L-ratio of the first field effect transistor equals the above fraction.

In a yet further embodiment, Metal-Oxide Semiconductor Field Effect Transistors (MOSFET's) are used for both the output stage and the current generator circuit, having their gates parallel connected, providing a control input of the output stage.

With the electrical circuit arrangement according to the invention, in further embodiments thereof, amplifier and voltage control circuits are provided.

The invention further relates to a method for delivering an output current by an electrical circuit arrangement comprising an output stage having an output terminal for delivering the output current, and at least one feedback circuit operatively connected to the output terminal, characterized by generating a current which is a fraction of the output current and adding same to said output current.

BRIEF DESCRIPTION OF THE DRAWINGS

The invention will now further be described by referring to the enclosed drawings.

DETAILED DESCRIPTION OF THE PREFERRED EMBODIMENTS

Figure 1:
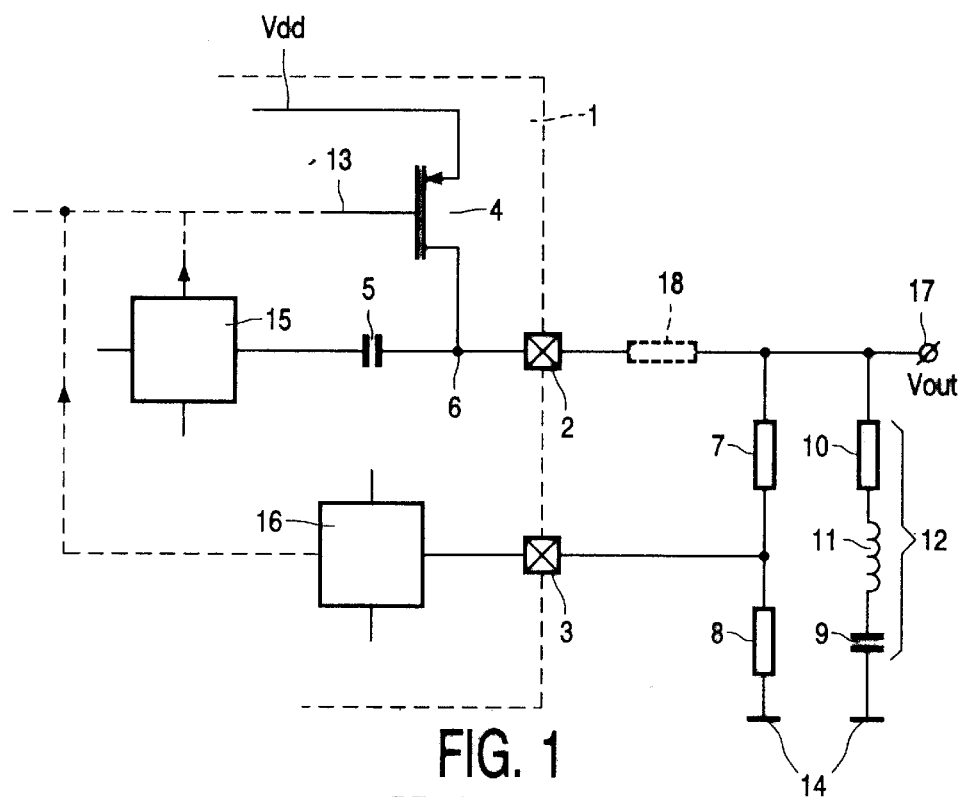
FIG. 1 shows part of a circuit diagram of a prior art output stage and feedback circuitry.

FIG. 1 shows part of an integrated circuit (IC)1 indicated by dashed lines, and comprising an output terminal 2 and a low frequency or DC feedback terminal 3. The output stage of IC1 is comprised of a P-channel Metal-Oxide Semiconductor Field Effect Transistor (P-MOSFET) 4 which connects with its conduction path between a voltage supply line Vdd and a node 6. P-MOSFET 4 is driven by a control signal on a control line 13. Node 6 is connected to output terminal 2 and to a feedback capacitor 5 of IC1, for feeding a high frequency feedback circuit which, for clarity purposes, is simply indicated by a block 15.

The high frequency feedback circuit 15 controls the P-MOSFET 4 via the control line 13 as schematically indicated by a dashed arrow line from block 15 to control line 13.

Those skilled in the art will appreciate that the high frequency feedback circuit 15 is connected in order to damp transients in the output signal, i.e. the output current or output voltage and to provide a sufficient power ripple rejection at high frequencies. To this end, external of IC1, also a capacitor 12 connects to the output terminal 2 and system ground 14.

Between the output terminal 2 of IC1 and system ground 14 an external resistive voltage divider connects, comprising first and second series connected resistors 7, 8, respectively. The junction of the series connected first and second resistors 7, 8 connects to feedback terminal 3. The voltage divider delivers a feedback signal to a low frequency or DC feedback circuit 16 of IC1, indicated in the form of a block which connects to feedback terminal 3. The DC feedback circuit controls P-MOSFET 4 via its control line 13, as schematically indicated by a dashed arrow line from block 16 to control line 13.

Capacitor 12 is shown in its equivalent circuit diagram form, that is a series connection of its equivalent series resistance (ESR) 10, its equivalent series inductance (ESL) 11 and its capacitance 9.

In practice, capacitor 12 has a value of, for example, 2.2 $\mu F$ to absorb output current transients and to obtain a good power ripple rejection for higher frequencies of the output voltage Vout which, during operation, is present at the output terminal 2.

The capacitance 9 and the equivalent series inductance 11 of the capacitor 12 together form a series resonance circuit. As will be appreciated by those skilled in the art, this series resonance circuit, at a particular frequency, called the eigenfrequency, will have a zero impedance. Accordingly, at the eigenfrequency the effective impedance between the output terminal 2 and signal ground 14 equals the equivalent series resistance 10. Preferably, this equivalent series resistance 10 is very small to provide a sufficient damping of output signal transients. Accordingly, at the eigenfrequency of the capacitor 12, the output terminal 2 is virtually short circuited to signal ground 14. Therefore at the eigenfrequency, no feedback signal will be delivered to the feedback circuit 15, 16, due to which the circuit arrangement becomes unstable.

In practice, a number of solutions have been proposed. By reducing the gain of the circuit arrangement at a reduced feedback signal, stability can be guaranteed. However, as a consequence of the reduced system gain there is less power ripple rejection, less DC accuracy and less load regulation. An other known solution is to apply a capacitor 12, having a relatively high equivalent series resistance. However, this leads to a larger dip in the output voltage at an output current transient response and less power ripple rejection. It is also possible to connect an additional resistor in series with the capacitor 12. However, this is even less desirable, since it introduces an extra external component and provides the same disadvantages as applying a capacitor with a relatively high equivalent series resistance. Still an other option would be to connect the capacitor 12 not to the output terminal 2, but to an additional terminal, which internally of IC1 connects by a resistor to the output terminal. However, this has the disadvantage of an extra terminal at the integrated circuit housing and, of course, the disadvantages mentioned above with respect to the use of a capacitor having a relatively high equivalent series resistance. A further option is to connect a resistor in series with the output terminal 2 and a load connection terminal 17, as indicated by resistor 18, shown in dashed lines.

As disclosed above in connection with the prior art document, such a resistor 18 increases the output impedance of the circuit arrangement, viewed from the load terminal 17.

Figure 2:
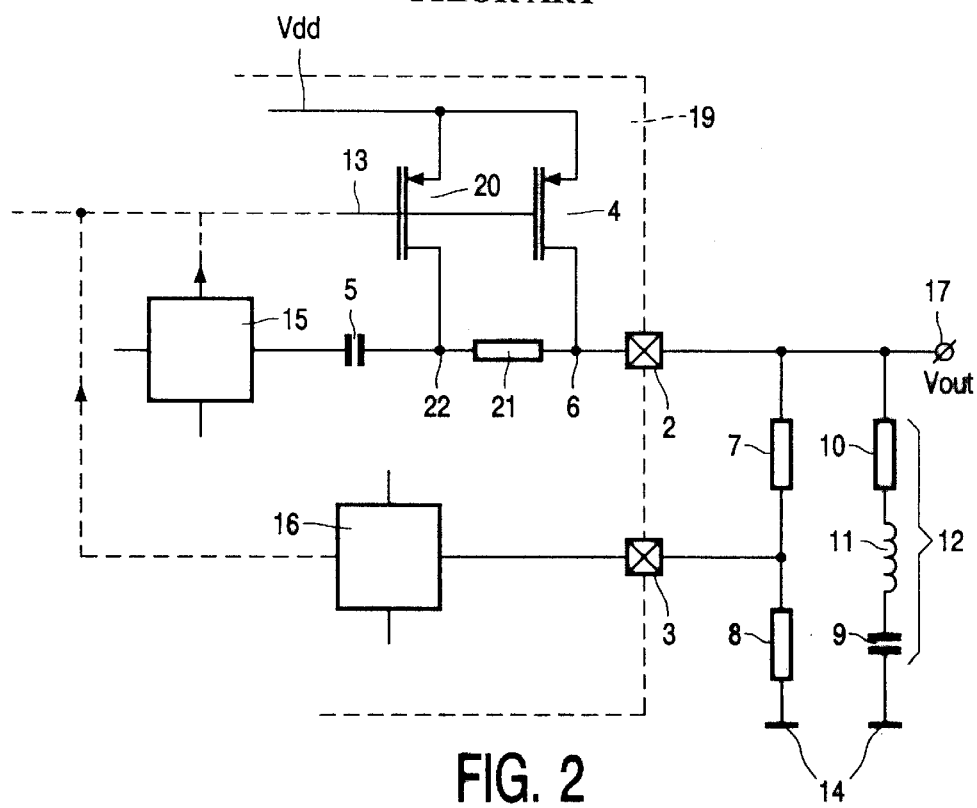
FIG. 2 shows the circuit diagram of FIG. 1 enhanced with a current generator circuit according to a preferred embodiment of the invention.

FIG. 2 shows the circuit arrangement of FIG. 1, in which the above described feedback instability at or near the eigenfrequency of the capacitor 12 has been solved by incorporating a current generator circuit 20, which connects by a resistive element 21 to the output terminal 2. The current generator circuit 20 is arranged for generating a current which is a fraction of the output current delivered by the output stage, i.e. P-MOSFET 4.

In the embodiment shown, the current generator circuit 20 comprises a P-MOSFET having its gate parallel connected to the gate of P-MOSFET 4 and the control line 13, and having its source connected to the source of P-MOSFET 4 and Vdd. The drain of the P-MOSFET operating as the current generator circuit 20 connects via a node 22 and the resistor or resistive element 21 to the drain of the P-MOSFET 4 and the output terminal 2, via node 6.

In the integrated circuit arrangement IC 19 according to the invention, the feedback capacitor 5 connects with one terminal to the node 22 and with an other terminal to the high frequency feedback circuit 15. The low frequency signal is obtained and connected in the same manner as disclosed with reference to FIG. 1. The width over length ratio (W/L) of the P-MOSFET 4 of the output stage and the P-MOSFET of the current generator circuit 20 has been chosen such that the W/L-ratio of the P-MOSFET forming the current generator circuit 20 divided by the W/L-ratio of the P-MOSFET forming the output stage 4 is less than 0.1 and preferably of the order of 0.01. Accordingly, the current generator circuit 20 generates a current which is a fraction less than 0.1 and preferably of the order of 0.01 of the current delivered by the output stage P-MOSFET 4.

In case of short circuiting the output terminal 2 at the eigenfrequency of the capacitor 12, the current produced by the current generator circuit 20, which is added to the current produced by the output stage 4, provides a voltage drop across the resister or resistive element 21, such that at the node 22 a feedback signal for the high frequency feedback circuit 15 remains available.

Because the resistor or resistive element 21 is not in the conduction path of the output stage 4, the output impedance at the output terminal 2 is not affected by the resistance of resistive element 21.

Accordingly, the circuit arrangement 19 of the invention provides a stable feedback loop also at high frequencies at which the output terminal 2 is short circuited, i.e. at or near the eigenfrequency of the capacitor 12, while the output impedance and, consequently, the open loop gain of the circuit arrangement 19 is essentially not decreased, neither the DC- accuracy of the DC or low frequency feedback signal.

In order that the current generated by the current generator P-MOSFET 20 is a replica of the output current at the output terminal 2, the resistor or resistive element 21 should have a resistance value of the order of 10 Ohm and the current flowing through it should not exceed 500 $\mu A$.

Accordingly, the voltage drop over the resistor or resistive element 21 will be at maximum 5 mV, sufficiently less in that the current through the P-MOSFET 20 is an exact copy of the current trough the P-MOSFET 4.

Those skilled in the art will appreciate that the current generator circuit according to the invention can be implemented in various manners, adapted to the design of the output stage and the output current delivered thereby. Further, instead of P-MOSFET's the embodiment disclosed and discussed is likewise applicable to N-MOSFET's as well as bipolar transistors.

The solution according to the invention is generally applicable to integrated or non-integrated electrical circuit arrangements 19 designed as an amplifier device for both analogue and digital signals, a power supply control device and the like enjoying the benefits of the invention, i.e. an increased bandwidth and higher open loop gain compared to prior art circuit arrangements.

What is claimed is:

1. An electrical circuit arrangement (19), comprising an output stage (4) having an output terminal (2) for delivering an output current, and at least one feedback circuit (15, 16) operatively connected to said output terminal (2), characterized by a current generator circuit (20), arranged for generating a current which is a fraction of said output current, wherein said current generator circuit (20) connects by a resistive element (21) to said output terminal (2) and a first feedback circuit (15) connects via said resistive element (21) to said output terminal (2).

2. An electrical circuit arrangement (19) according to claim 1, wherein said first feedback circuit (15) capacitively (5) connects to said resistive element (21).

3. An electrical circuit arrangement (19) according claim 1, wherein a second feedback circuit (16) connects by a resistive voltage diver (7, 8) to said output terminal (2).

4. An electrical circuit arrangement (19) according to claim 1, wherein said fraction is less than 0.1.

5. An electrical circuit arrangement (19) according to claim 1, wherein said fraction is of the order of 0.01.

6. An electrical circuit arrangement (19) according to claim 1, wherein said output stage (4) comprises a first field effect transistor ans said current generator circuit (20) comprises a second field effect transistor, wherein the W/L ratio of said second field effect transistor divided by the W/L ratio of said first field effect transistor equals said fraction.

7. An electrical circuit arrangement (19) according to claim 1, wherein said field effect transistors are Metal-Oxide Semiconductor Field Effect Transistors (MOSFET's).

8. An electrical circuit arrangement (19) according to claim 7, wherein said field effect transistors comprise parallel connected gates.

9. An electrical circuit arrangement (19) according to claim 1, wherein said resistive element (21) has a resistance value such that during operation the voltage drop across said resistive element (21) is in the mV range, typically a resistance value of the order of 10 ohm or less.

10. An electrical circuit arrangement (19) according to claim 1, arranged as an electrical amplifier device.

11. An electrical circuit arrangement (19) according to claim 1, arranged as a voltage control device.

* * * * *